US009065439B2

(12) United States Patent
Sharma et al.

(10) Patent No.: US 9,065,439 B2
(45) Date of Patent: Jun. 23, 2015

(54) CLOCK BUFFER

(71) Applicant: NXP B.V., Eindhoven (NL)

(72) Inventors: Vibhu Sharma, Eindhoven (NL); Rinze Ida Mechtildis Pete Meijer, Eindhoven (NL); Jose Pineda de Gyvez, Eindhoven (NL)

(73) Assignee: NXP B.V., Eindhoven (NL)

( * ) Notice: Subject to any disclaimer, the term of this patent is extended or adjusted under 35 U.S.C. 154(b) by 6 days.

(21) Appl. No.: 14/168,910

(22) Filed: Jan. 30, 2014

(65) Prior Publication Data

US 2014/0225645 A1    Aug. 14, 2014

(30) Foreign Application Priority Data

Feb. 12, 2013    (EP) .................................... 13154865

(51) Int. Cl.
*H03K 19/0185* (2006.01)
*H03K 19/00* (2006.01)
*G06F 1/10* (2006.01)
*H03K 19/0175* (2006.01)

(52) U.S. Cl.
CPC .... *H03K 19/0016* (2013.01); *H03K 19/018521* (2013.01); *G06F 1/10* (2013.01); *H03K 19/017581* (2013.01)

(58) Field of Classification Search
CPC ....... G06F 1/10; G06F 17/505; H01L 23/522; H03K 5/0375; H03K 5/133; H03K 19/018521; H03K 19/096; H03K 19/0963; H03K 19/17788
USPC ..................................................... 326/93–98
See application file for complete search history.

(56) References Cited

U.S. PATENT DOCUMENTS

| 6,163,178 | A | 12/2000 | Stark et al. |
|---|---|---|---|
| 6,897,696 | B2 | 5/2005 | Chang |
| 7,095,265 | B2 | 8/2006 | Nguyen et al. |
| 7,196,542 | B1 * | 3/2007 | Lee et al. ........................ 326/38 |
| 7,382,168 | B2 * | 6/2008 | Bhattacharya et al. ........ 327/112 |
| 7,394,302 | B2 * | 7/2008 | Shimazawa .................... 327/277 |
| 8,179,181 | B2 * | 5/2012 | Lung et al. ..................... 327/276 |
| 8,680,648 | B2 * | 3/2014 | Rowhani et al. ............... 257/529 |
| 2006/0132212 | A1 | 6/2006 | Shimazawa |
| 2007/0046338 | A1 | 3/2007 | Bhattacharya et al. |

(Continued)

FOREIGN PATENT DOCUMENTS

| EP | 0 184 875 A1 | 6/1986 |
|---|---|---|
| EP | 1 607 887 A2 | 12/2005 |
| JP | 2001-166845 A | 6/2001 |

OTHER PUBLICATIONS

Parthibhan, N. et al. "Clock Skew Optimization in Pre and Post CTS", Intl. Conf. Advances in Computing and Communications, pp. 146-149 (Aug. 2012).

(Continued)

*Primary Examiner* — Alexander H Taningco
*Assistant Examiner* — Kurtis R Bahr (57) ABSTRACT

A tuneable buffer circuit for use in a clock tree has multiple buffers in parallel, each buffer having a grounding function, and also a bypass switch in parallel with the buffers. The circuit has a normal mode of one buffer connected into circuit, a first low voltage mode of multiple buffers connected into circuit in parallel without grounding function, a second low voltage mode of the buffers connected into circuit in parallel with grounding function and a bypass mode.

12 Claims, 8 Drawing Sheets

(56) References Cited

U.S. PATENT DOCUMENTS

2009/0179680 A1    7/2009    Reuland et al.
2010/0090738 A1    4/2010    Changchein et al.
2011/0121875 A1    5/2011    Lung et al.

OTHER PUBLICATIONS

Pu Y. et al. "Post-Silicon Clock Deskew Employing Hot-Carrier Injection Trimming With On-Chip Skew Monitoring and Auto-Stressing Scheme for Sub/Near Threshold Digital Circuits", IEEE Trans. on Circuits and Systems II: Express Briefs, vol. 58, No. 5, pp. 294-298 (May 2011).

Mahoney, P. et al. "Clock Distribution on a Dual-Core, Multi-Threaded Itanium®-Family Processor", IEEE Intl. Solid-State Circuits Conf., pp. 292-293 & 599 (Feb. 2005).

Kurd, N.A. et al. "A Multigigahertz Clocking Scheme for the Pentium® 4 Microprocessor", IEEE J. of Solid-State Circuits, vol. 36, No. 11, pp. 1647-1653 (Nov. 2001).

Macken, P. et al. "A Voltage Reduction Technique for Digital Systems", IEEE Intl. Solid-State Circuits Conf., pp. 238-239 (Feb. 1990).

Extended European Search Report for EP Patent Appln. No. 13154865.3 (Aug. 12, 2013).

\* cited by examiner

CLOCK BUFFER

CROSS-REFERENCE TO RELATED APPLICATIONS

This application claims the priority under 35 U.S.C. §119 of European patent application no. 13154865.3, filed on Feb. 12, 2013, the contents of which are incorporated by reference herein.

This invention relates to a clock buffer circuit.

In particular, the invention relates to a programmable clock buffer suitable for operation in a wide supply voltage range.

The need for such a buffer is prompted by the fact that the clock tree requirements at nominal and low supply values conflict with each other. For instance, at nominal supply voltage values, the interconnect resistance is dominant while at low supply values the buffer output impedance is dominant. Consequently, a clock tree synthesized at the nominal voltage supply, meeting timing requirements is not functional for low supply voltages and vice versa. Secondly overdesigning done for meeting timing constraints for a low voltage synthesized clock tree results in excessive power consumption at the nominal supply voltage.

Dynamic Voltage Scaling (DVS) is an approach used to reduce energy consumption by adapting the system supply voltage over a large range depending on the performance requirement. This in particular is beneficial for systems with time-varying throughput. Variability resilience is very important and of critical concern for dynamic voltage scalable designs. In particular the clock tree network is of utmost concern in order to achieve low power and robust design.

The clock network can consume up to 40%-50% of the power budget. The clock skew should be minimized, and timing margins have to be well defined against inter and intra die variations. Similarly, slew needs to be well controlled in order to prevent the degradation of set up and hold time violations. The clock tree network also has to be resilient to supply voltage variations.

The optimization of the clock tree design over a large voltage range is very challenging due to conflicting trade-offs of weak inversion (low voltages) and strong inversion (high voltages). In particular, designing for low voltages requires upsizing to ensure robustness. However, due to the static nature of the design, the specification recommended for low voltage operation leads to excessive power consumption at high voltages and can also result in hold timing violations.

One known approach to address these problems is to use delay buffers to provide skew minimization at higher voltages.

Figure 1:
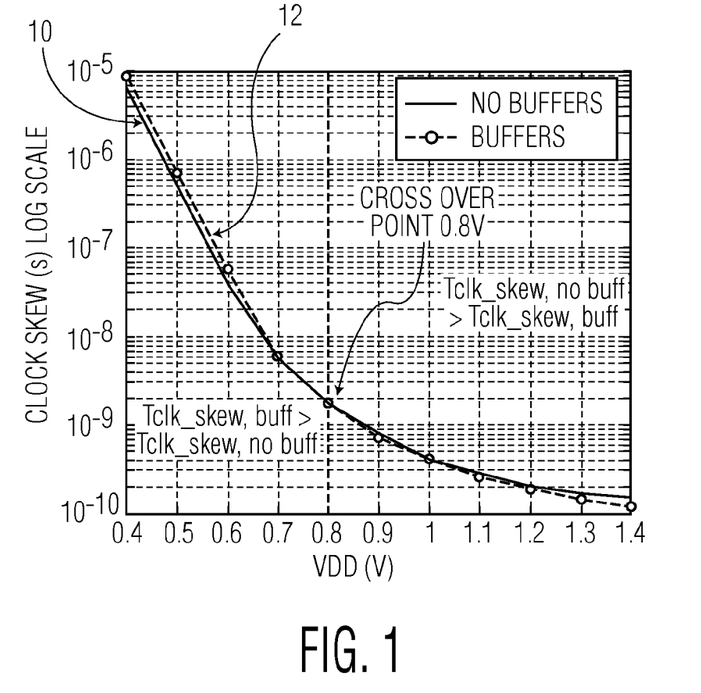
FIG. 1 shows the Impact of voltage scaling on clock skew for buffered and un-buffered clock trees.

FIG. 1 shows the Impact of voltage scaling on clock skew for buffered and un-buffered clock trees.

Plot 10 shows the clock skew as a function of supply voltage without buffers, and plot 12 shows the clock skew with buffers. FIG. 1 shows that for the sub-threshold region, adding clock buffers rather increases the clock skew. Thus, buffer insertion for minimizing clock skew for super threshold voltages is not an optimum technique for near threshold voltage designs.

The sizing optimization for a given skew target at lower voltages results in unnecessarily excessive power consumption at higher voltage levels.

Figure 2:
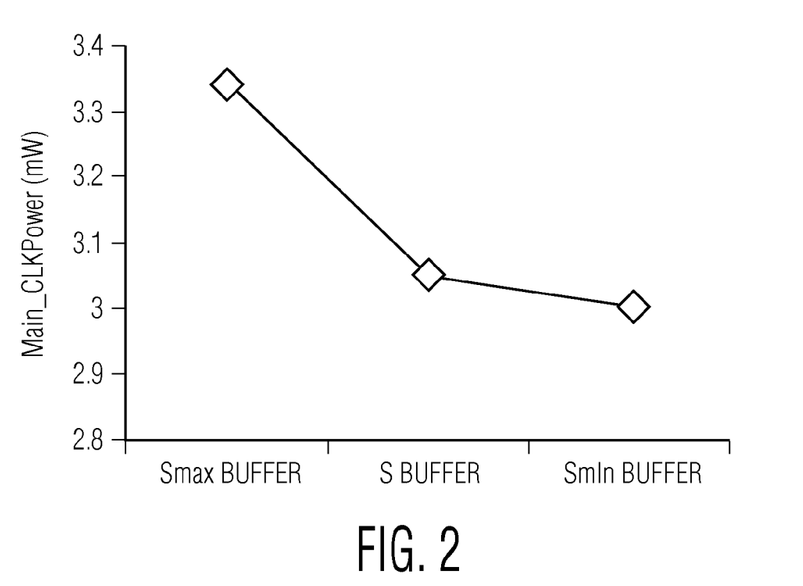
FIG. 2 illustrates the impact of buffer sizes on power consumption for a given target skew value.

FIG. 2 illustrates the impact of buffer sizes on power consumption for a given target skew value. The buffer "Smax buffer" is a buffer size optimized for lower voltage and "Smin buffer" represents the most optimized sized buffer for the given skew target.

Various solutions to the problems outlined above have been proposed. Much prior art is focused on static clock buffer design, either optimized for lower voltages or for high voltages. Many approaches are not scalable for low and sub-threshold voltage levels.

It has also been suggested to use variable delay buffers and to set the delay as a function of a power mode of devices controlled by that particular branch of the clock tree. This approach is disclosed in U.S. 2011/012875. This approach is based on a power mode setting and does not respond dynamically to supply voltage variations.

According to the invention, there is provided an apparatus and method as defined in the claims.

In one aspect, the invention provides a tuneable buffer circuit for use in a clock tree, comprising:
  a voltage sensor for sensing a supply voltage;
  a set of at least two buffers in parallel, each buffer having a grounding circuit for implementing a selectable grounding function;
  a bypass switch in parallel with the at least two buffers;
  a switching arrangement for switching between different modes of operation in dependence on the sensed supply voltage, wherein the modes comprise:
    a normal mode of one buffer connected into circuit;
    a first low voltage mode of the at least two buffers connected into circuit in parallel without grounding function;
    a second low voltage mode of the at least two buffers connected into circuit in parallel with grounding function; and
    a bypass mode of the buffers bypassed by the bypass switch.

This circuit enables different configurations to be used for different supply voltage conditions, so that the circuit is designed for wide supply voltage variation. Thus provides a design suitable for use in a dynamic voltage scalable clock tree network. Different control signals are provided for different supply voltage levels. The topology of the clock buffers in the clock tree is adjusted by the control signals, generated by the voltage sensor, depending on the voltage of operation.

The use of parallel branches provides a variable buffer drive strength to reduce extrinsic delay impact. This enables control of the delay spread by reducing the load-dominated extrinsic component delay and output slope degradation.

The grounding function is used to overcome the impact of device variability when operating at low voltages.

The grounding function can for example be implemented with NMOS transistors, and it is beneficial for ultralow voltages or near threshold voltage operation. Activation of these NMOS transistors lowers the switching threshold of the input inverters of the buffers and reduces the delay spread arising because of sloppy transitions.

A bypass function is also enabled for sub-threshold voltages. At these sub-threshold voltages, the device resistance becomes more dominant compared to interconnect resistances. In this case, bypassing of the buffers prevents delay spread by bypassing these devices, which are prone to variability.

This buffer circuit enables a voltage scalable clock tree design, whereas existing static clock tree designs are unable to meet challenges posed by conflicting timing closure requirements arising because of voltage scalability. The buffer design enables oversizing to be avoided, and thereby enables reduced power consumption for the same reliability levels.

Each buffer can comprise two inverters in series, and the grounding circuit is for selectively grounding the junction between the inverters. The grounding circuit can comprise a grounding transistor connected between the junction and ground, and an enabling switch between the input clock to the buffer circuit and the gate of the grounding transistor such that the grounding function is dependent on the input clock. This essentially provides an assist function to pull down the junction between the inverters to ground at the appropriate phase of the clock cycle. The grounding circuit can comprise a plurality of parallel grounding transistors.

The grounding circuit can further comprise a disabling transistor for turning off the grounding transistor or grounding transistors when the grounding function is not selected.

The voltage sensor can be for detecting that supply voltage is:

below a device threshold voltage (e.g. below ⅔ of the threshold voltage);

near the device threshold voltage (e.g. between ⅔ and ⁴⁄₃ of the threshold voltage);

between a device threshold voltage and an intermediate voltage level (e.g. between ⁴⁄₃ of the threshold voltage and ½ of the nominal supply voltage); or above the intermediate voltage level (e.g. above ½ of the nominal supply voltage).

There are thus three threshold levels. One is slightly below the threshold value (the ⅔ value), one is slightly above the threshold value (the ⁴⁄₃ value), and one is at an intermediate level, higher than the second threshold level but below the nominal voltage level (the ½ value). The actual values given are only examples, and more generally there are two levels between which the threshold level sits, and one higher level near but below the nominal voltage. The switching arrangement is then adapted to:

select the bypass mode if the supply voltage is below the device threshold voltage;

select the low voltage mode with grounding function if the supply voltage is near the device threshold voltage;

select the low voltage mode without grounding function if the supply voltage is between the device threshold voltage and an intermediate voltage level; or select the normal mode if the supply voltage is above the intermediate voltage level.

The buffer circuit can be used in a clock tree.

The invention also provides a method of controlling a tuneable buffer circuit for use in a clock tree, the buffer circuit comprising a set of at least two buffers in parallel and a bypass switch in parallel with the at least two buffers, each buffer having a grounding circuit for implementing a selectable grounding function, wherein the method comprises:

sensing a supply voltage;

switching between different modes of operation in dependence on the sensed supply voltage, wherein the modes comprise:

a normal mode of one buffer connected into circuit;

a first low voltage mode of the at least two buffers connected into circuit in parallel without grounding function;

a second low voltage mode of the at least two buffers connected into circuit in parallel with grounding function; and a bypass mode of the buffers bypassed by the bypass switch.

An example of the invention will now be described in detail with reference to the accompanying drawings, in which.

The invention provides a tuneable buffer circuit for use in a clock tree which has multiple buffers in parallel, each buffer having a grounding function, and also a bypass switch in parallel with the buffers. The circuit has a normal mode of one buffer connected into circuit, a first low voltage mode of multiple buffers connected into circuit in parallel without grounding function, a second low voltage mode of the buffers connected into circuit in parallel with grounding function and a bypass mode.

Figure 3:
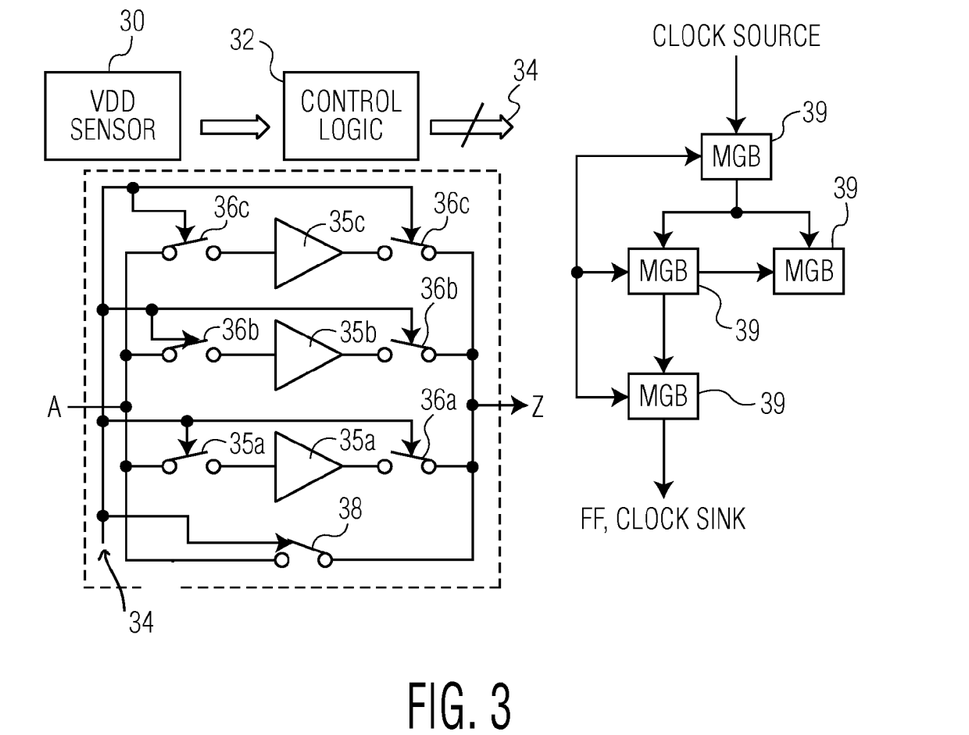
FIG. 3 illustrates concept underlying the buffer arrangement of the invention.

FIG. 3 illustrates concept underlying the buffer arrangement of the invention, and which can be described as a multiple assisted gate isolated clock buffer. Depending upon the operating voltage, the buffer adapts its topology.

The buffer consists of three main components, namely:

(i) a supply voltage (VDD) sensor 30;

(ii) control logic 32; and (iii) a reconfigurable buffer portion 34 based on the control logic settings.

The voltage sensor 30 is used to detect the operating voltage and the accompanying control logic 32 is used to generate configuration control signals 34 based on the voltage sensor output. The configuration control signals are used to select the appropriate buffer topology suited for that voltage range of operation (as detected by the voltage sensor).

The reconfigurable buffer portion 34 comprises a set of parallel buffer paths between an input A and output Z. Each buffer path has a buffer 35a-35c and associated isolating switches 36a-36c. There is also a path with no buffer formed of switch 38.

FIG. 3 also shows a clock tree, in which the clock source is routed to different locations though the configurable buffer circuits 39 of the invention and ultimately to a clock sink.

Each buffer also has a grounding function, explained below.

Figure 4:
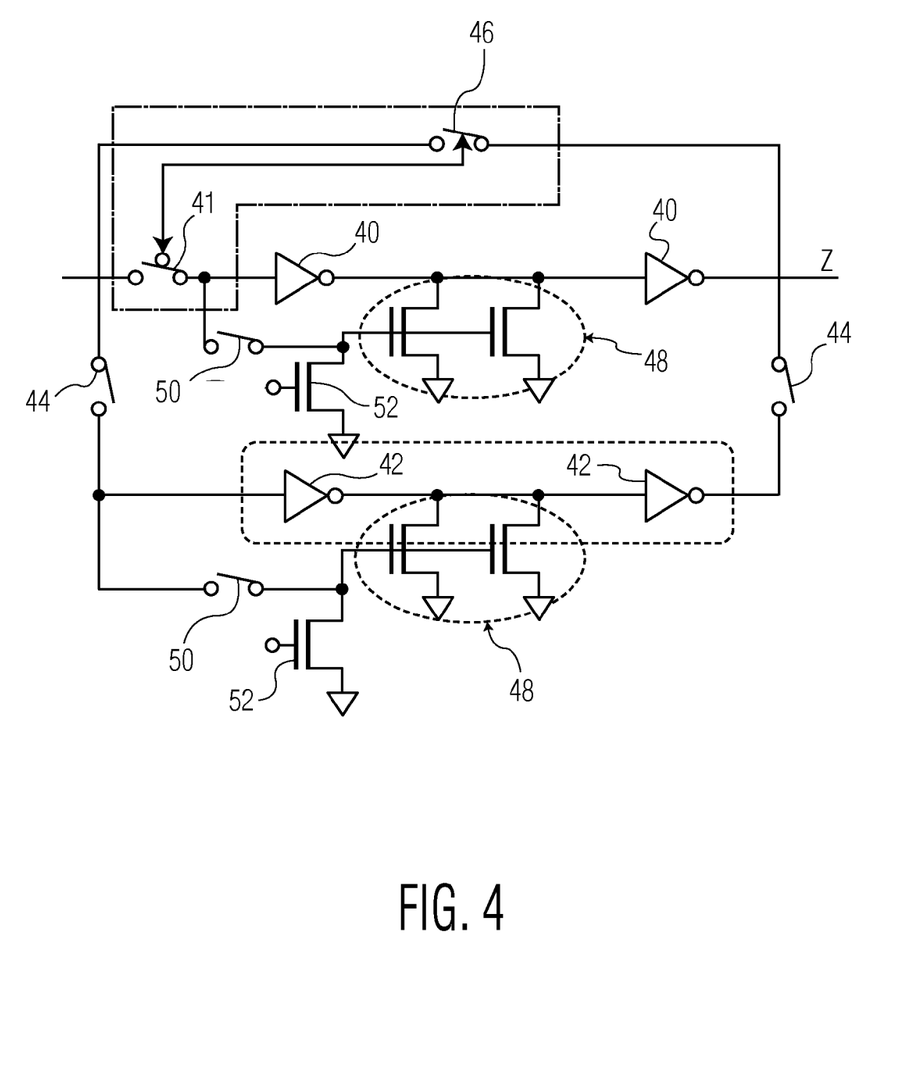
FIG. 4 shows one example of buffer circuit implementation of the invention.

FIG. 4 shows one example of buffer circuit Implementation.

The circuit comprises a main buffer branch between the input A and output Z, shown as two inverters 40 in series. A switch 41 enables this branch to be connected in or out of circuit.

A second buffer branch (in parallel with the first) is connected between the input and output, with two inverters 42 in series. Switches 44 enable this branch to be connected in or out of circuit. These switches are controlled by a "redundancy" control signal.

A third branch (in parallel with the other two) is a bypass branch comprising a switch 46. When this bypass switch 46 is closed, the other switches 41,44 are open so that the delay branches are out of circuit. This switching is controlled by a "bypass" control signal.

Each delay branch includes a grounding circuit 48 which can be activated to pull the signal between the inverters to ground. This operation is controlled by switches 50.

A control signal is used to control switches 50 which couple the input signal to the gates of the NMOS transistors used in the grounding circuit. This control signal is an "assist" control signal in that it results in NMOS assistance, which is of use when operating near the threshold voltage. Thus, when the assist control signal is asserted, the input clock signal is used as a control to activate the grounding transistors. Since the ground circuit is after the first inverter, this means additional grounding is provided (i.e. when the clock input is high) when the signal between the inverters is low.

When the control assist control signal is low, so that the switches 50 are open, a transistor 52 pulls the gates of the transistors in the grounding circuits low, thereby turning them off, and disabling the grounding circuit. The transistor gate signal for transistor 52 is thus a complementary version of the assist control signal.

This circuit has a number of possible configurations:
1 Main branch only activated.
2. Both branches activated—with grounding assistance.
3. Both branches activated—without grounding assistance.
3. Bypass branch activated.

As explained below, these different modes of operation are appropriate for different supply voltage conditions. They are controlled by the three controls signals outlined above ("assist", "bypass" and "redundancy").

The circuit of the invention solves the problem associated with traditional clock buffer design in which the clock buffer design is fixed (static) and cannot dynamically adapt to meet timing closure at different voltage levels for DVS compatible system design.

The buffer circuit is configured in relation to the supply voltage, and in particular the relationship between the supply voltage and the threshold voltage of the circuit components used, for example the MOSFET threshold voltage.

The transistor region of operation depends on the supply voltage. As the supply voltage is reduced to approach sub-threshold operation, the region of operation shifts from strong inversion to moderate inversion and finally to weak inversion (below threshold). The strong inversion region is known as the super threshold regime, and is characterized by large current drives and a supply voltage substantially above Vth, the threshold voltage of the transistor. The moderate inversion has lower current drives as compared to the super threshold regime and an operating voltage near to Vth. In the super threshold region, the current is fairly linear in nature. The weak inversion sub-threshold regime, is characterized by small current drives and a supply voltage below Vth. The transistor current Ion in the sub-threshold regime is exponentially dependent on Vth and supply Vdd.

In sub-threshold circuits, the supply voltage is reduced well below the threshold voltage of a transistor. This results in the quadratic reduction of power consumption with respect to the supply voltage (power being proportional to the square of voltage). Therefore, sub-threshold circuits are classified as ultra low power circuits.

There are many application areas for usage of sub-threshold design ranging from energy constrained, low performance biomedical implants, sensor nodes and RFID, to energy constrained DVS (dynamic voltage scalable) mobile devices that occasionally need to support a high performance mode. Ultra dynamic voltage scaling from strong inversion (super threshold, high performance) to weak inversion (sub-threshold, low power), enables this type of bursty operation for portable mobile devices.

The current in the sub-threshold region is a leakage current, and is considered to be undesirable when operating the transistor in the super threshold region. However, the leakage current is utilized by sub-threshold circuits as their conduction current.

For super threshold operation, only the main branch is activated, to save power.

For low supply voltage operation (but above the threshold voltage), the redundancy control signal activates the second buffer branch 42 and results in the output node Z being driven by multiple buffers to reduce the extrinsic delay.

For these two parallel buffers, the input signal is same (same strength and same arrival time). Providing multiplicity increases the drive strength and improves delay.

If a buffer of size S1 is designed to meet timing constraints designed for operation at VDD/2, this will be an overdesigned buffer for operation at VDD. Thus, the use of parallel buffers essentially replaces this S1 size with two smaller S2 size buffers. In this way, they together meet the design target at VDD/2 but with the option to disable one buffer at VDD and thereby be more power efficient.

In one particular example, two similarly sized buffers can be used. Theoretically, the number of buffers can be extended to N and can be of different sizes.

The assist control signal is also used to activate the grounding circuits, thereby lowering the switching threshold and reducing the intrinsic delay, which also becomes relevant as the supply voltage VDD is scaled down.

Both buffer branches are bypassed for sub-threshold voltages where the impact of device performance becomes more dominant than the delays caused by interconnects.

For supply voltages below the nominal supply voltage level but well above the threshold level, both branches are used, but without requiring grounding assistance (which consumes power). The addition of buffers reduces delay for better performance at nominal supply voltages. The buffer insertion is advantageous because of the shorter interconnect segments and sharper slew rates to the inputs of the following buffers.

At sub-threshold voltages, the total resistance becomes dominated by the MOSFET device resistance compared to the interconnect resistance.

Therefore, the buffers added for the clock tree design at nominal supply voltage would result in increased impact of variability on the delay spread at sub threshold voltages. They also then unnecessarily increase the energy consumption. Thus, the devices are bypassed for sub-threshold voltages.

At the nominal supply voltages a regular buffer topology can be utilized, with a single buffer branch.

The mode of operation is thus based on the supply voltage level.

Figure 5:
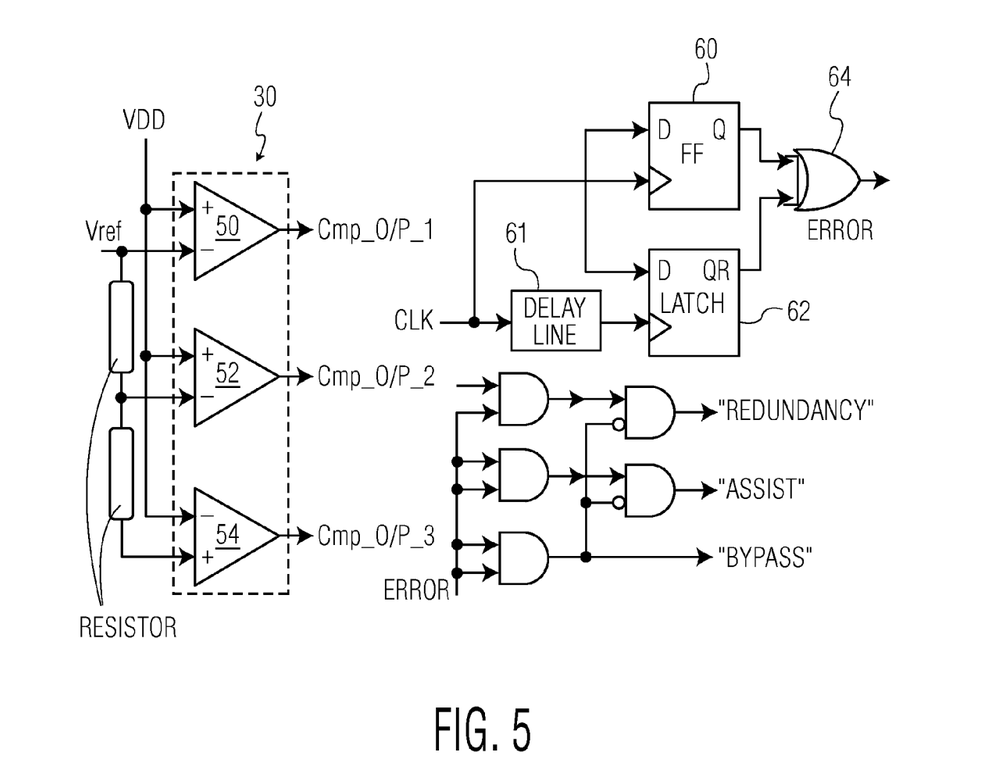
FIG. 5 shows the supply voltage sensor 30 and shows control logic to derive the switching control signals.

FIG. 5 shows the supply voltage sensor 30 and shows control logic to derive the switching control signals.

The sensor comprises a set of three comparators. A first comparator 50 detects a highest voltage level Vref, A resistor ladder derives two further voltage levels and a second and third comparator 52, 54 use these references.

The comparator outputs are shown in the table below for a nominal supply voltage of 1.2V.

| VDD | Comp 1 Output | Comp 2 Output | Comp 3 Output | Assist | Redundancy | Bypass |
|---|---|---|---|---|---|---|
| 0.9 V-1.2 V and above | 0 | 0 | 0 | 0 | 0 | 0 |
| 0.75 V-0.9 V | 1 | 0 | 0 | 0 | 1 | |
| 0.5 V-0.75 V | 1 | 1 | 0 | 1 | 1 | 0 |
| 0 V-0.5 V | 1 | 1 | 1 | 0 | 0 | 1 |

A timing error is detected by a timing sensor for 0.9V.

This timing error is detected by the latch circuit shown in FIG. 5. The clock signal is applied to the clock input of a first latch 60 and a delayed version is applied to a second latch 62. The delay is based on a replication of part of the clock tree. An error signal is generated based on detecting that an incorrect sampling result is obtained and this is used to enable the control signals to change the buffer configuration.

The timing sensor is thus based on a voltage comparator array, error detection circuitry and a controller.

The voltage comparator array 30 determines the voltage of operation. It consists of resistive ladder network for generation of reference voltages for different voltage sense amplifiers, for example three voltage sense amplifiers as shown. The other input to these sense amplifiers is the supply voltage VDD. The voltage comparator outputs a vector, such as {111} for sub-threshold voltage detection at less than 0.5V.

This output vector is used along with the output of error detection circuitry by the controller logic for generating the buffer control signals.

The error detection circuitry consists of a replica combinational path implemented as a delay line 61 (resembling a typical data combinational path of the circuit design), a flip flop, 60 a latch (sampling input data on delayed clock) and an XOR gate 64. During regular operation, when the flip flop 60 samples correct data, then the output of the XOR gate 64 compares this with the output of the latch 62 and the output is low.

However, when the data from the replica combinational logic arrives late, then the flip flop 60 samples incorrect data, which is compared by the XOR gate 64 with the output of the latch 62 (which is designed by taking margins, to ensure correct data sampling) and an error signal is flagged.

The control logic circuitry is triggered with this error signal and determines an appropriate output {"redundancy", "assist", or "bypass"} depending on the voltage of operation. In this way, configuration of the buffers is adapted whenever an error signal from the timing error detector is detected. Voltage sensing is used to determine which configuration will be suitable.

The logic gate circuit in FIG. 5 shows that the three comparator signals are passed by AND gates when the timing error signal is high. Two AND gates with one inverted input are then used to implement the function shown in the table above.

At nominal supply voltages (e.g. VDD>⅔ VDDnom), the voltage comparator outputs are {0 0 0} as shown in the Table above and the control signals are disabled.

For the lower VDD levels, (e.g. just below ⅔ VDDnom) the voltage comparator outputs are {1 0 0}.

The comparator outputs {1 0 0} activate the redundancy switch control signal, which is used to increase the buffer strength by enabling the redundant buffer branch to reduce the delay spread.

As the voltage supply levels further reduce to the near threshold voltage range (e.g. below 0.75V), the voltage comparator output becomes {1 1 0} and the "assist" switch control signal is activated in addition to the "redundancy" switch control signal.

This enables the assist transistors (i.e. the grounding circuits) of the multiple buffers. For positive edge triggered designs, NMOS transistors are used for the assist mechanism, in this implementation. Similarly PMOS transistors can be used for negative edge triggered designs.

For sub-threshold voltages for (e.g. <0.5V), the voltage comparator outputs {1 1 1}.

The error signal activates the bypass switch control signal so that the clock tree becomes an un-buffered clock tree. For this sub-threshold region, adding clock buffers increases the clock skew. The bypass switch eliminates the buffers from the tree structure.

Figure 6A:
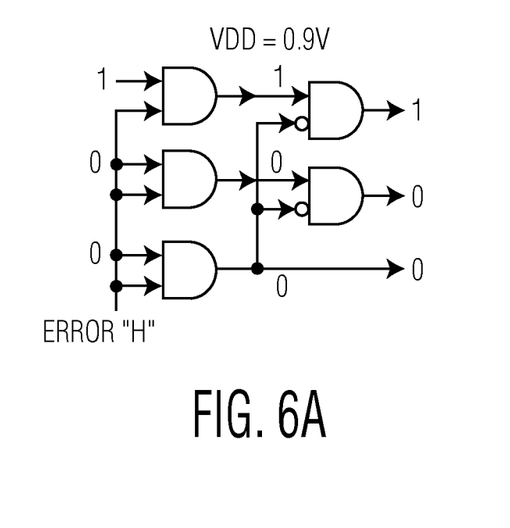
FIG. 6a shows the function of the logic circuit for low voltage operation and FIG. 6b shows the function of the logic circuit for comparator signals for sub-threshold voltage operation.
Figure 6B:
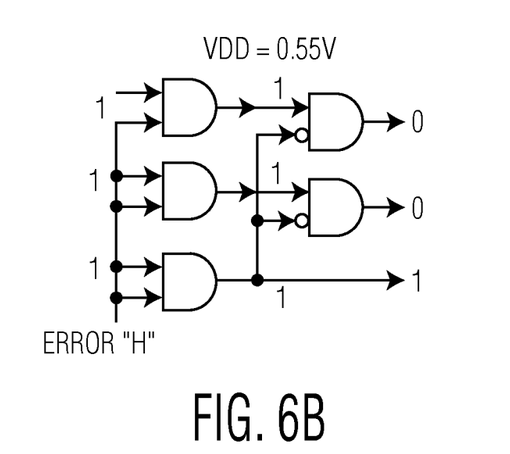

FIG. 6a shows the function of the logic circuit for comparator signals {1,0,0} (low voltage operation) and FIG. 6b shows the function of the logic circuit for comparator signals {1,1,1} (sub-threshold voltage).

Figure 7:
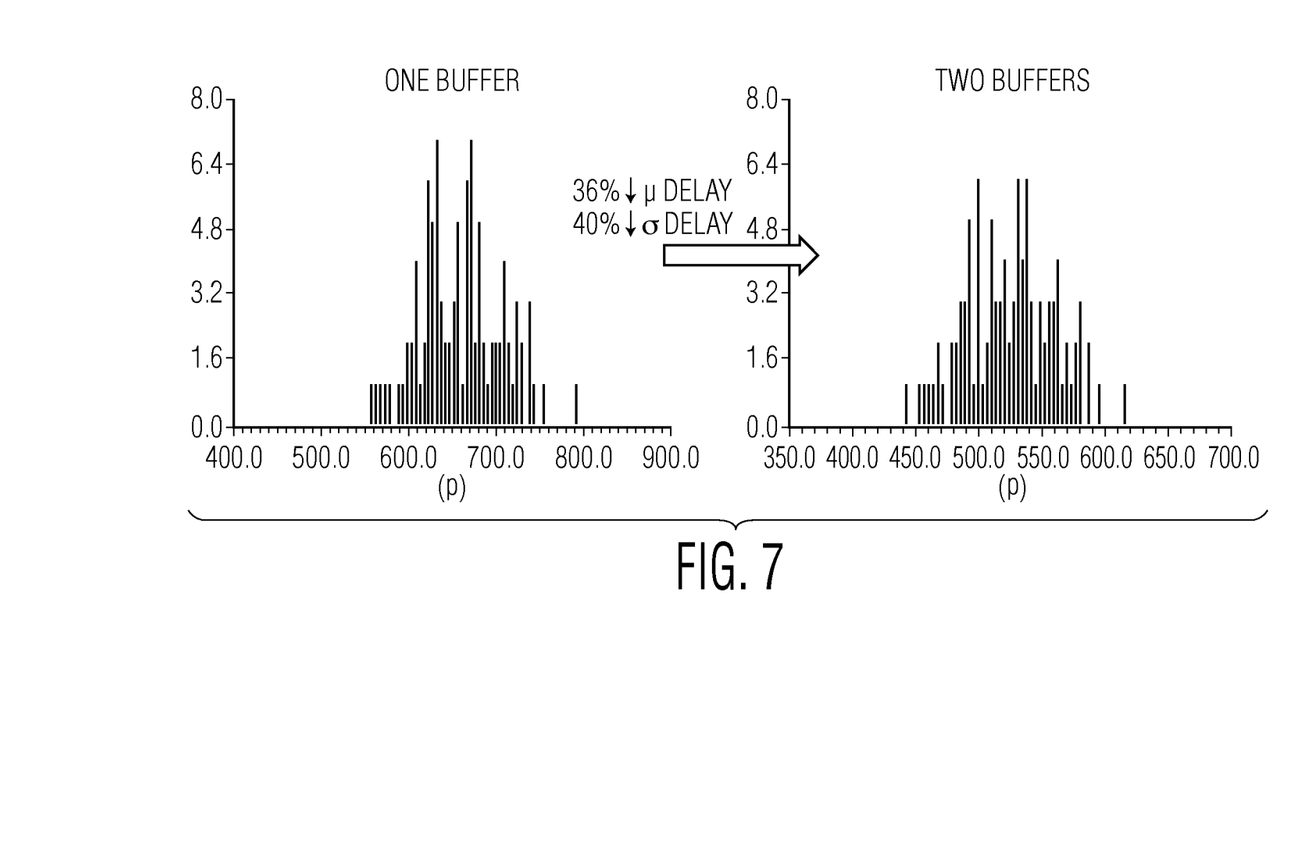
FIG. 7 shows that when both buffers of the arrangement are activated a 40% reduction in delay spread and 36% reduction in mean delay are obtained.

FIG. 7 shows that for low voltages VDD, when the redundancy switch activates the second buffer so that the output node Z is driven by 2 buffers, results in 40% reduction in delay spread and 36% reduction in mean delay at VDD=1.0V.

Figure 8:
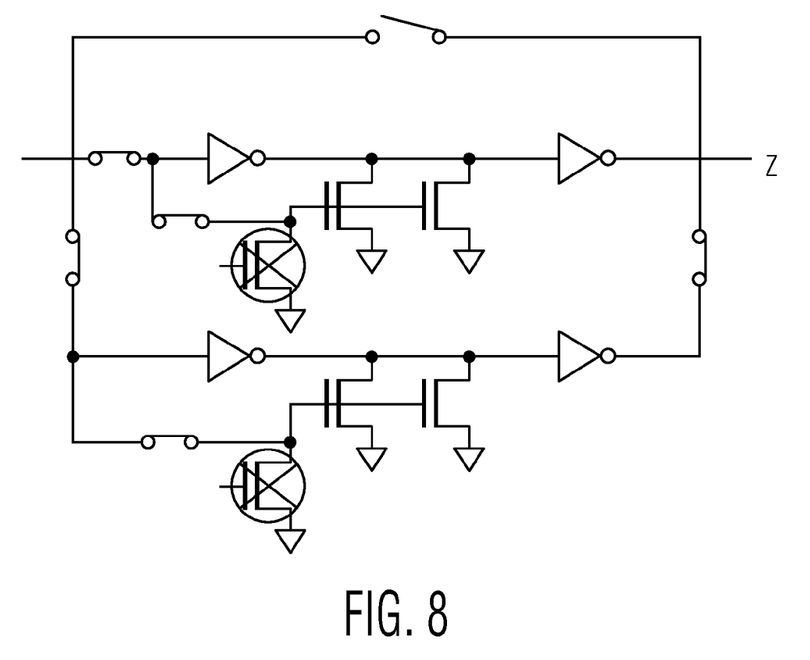
FIG. 8 shows the way the circuit of FIG. 4 is configured the near threshold voltage.

FIG. 8 shows the way the circuit (of FIG. 4) is configured at the near threshold voltage, with the assist and redundancy control signals active.

Both branches are connected in circuit and the grounding circuits are coupled to the clock input by virtue of the assist control signal. The grounding NMOS transistors reduce intrinsic delay by lowering the switching threshold of input gates.

Figure 9:
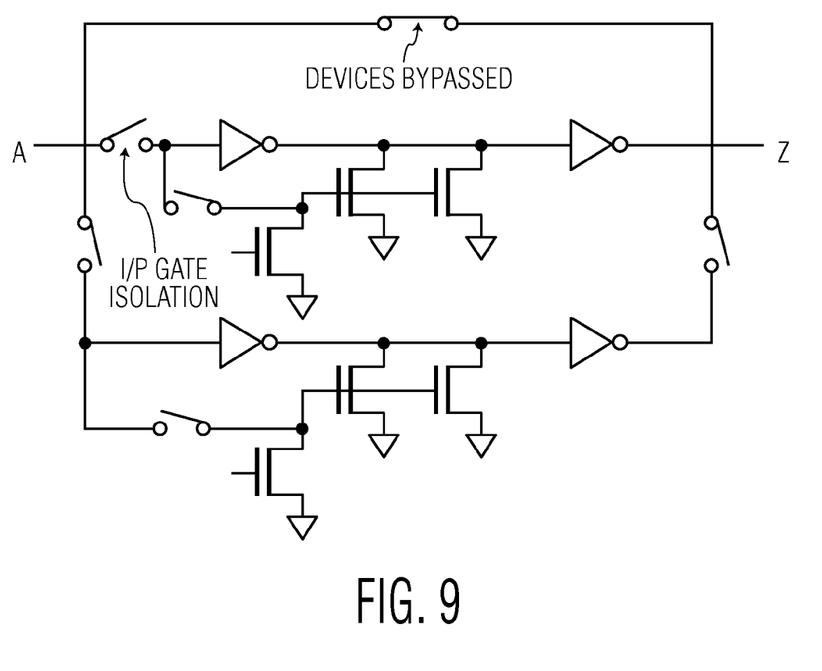
FIG. 9 shows the sub-threshold voltage configuration of the circuit.

FIG. 9 shows the sub-threshold voltage configuration of the circuit. For these ultra-low voltages, when device variations become more predominant, the transmission gate bypasses the device structure.

Figure 10:
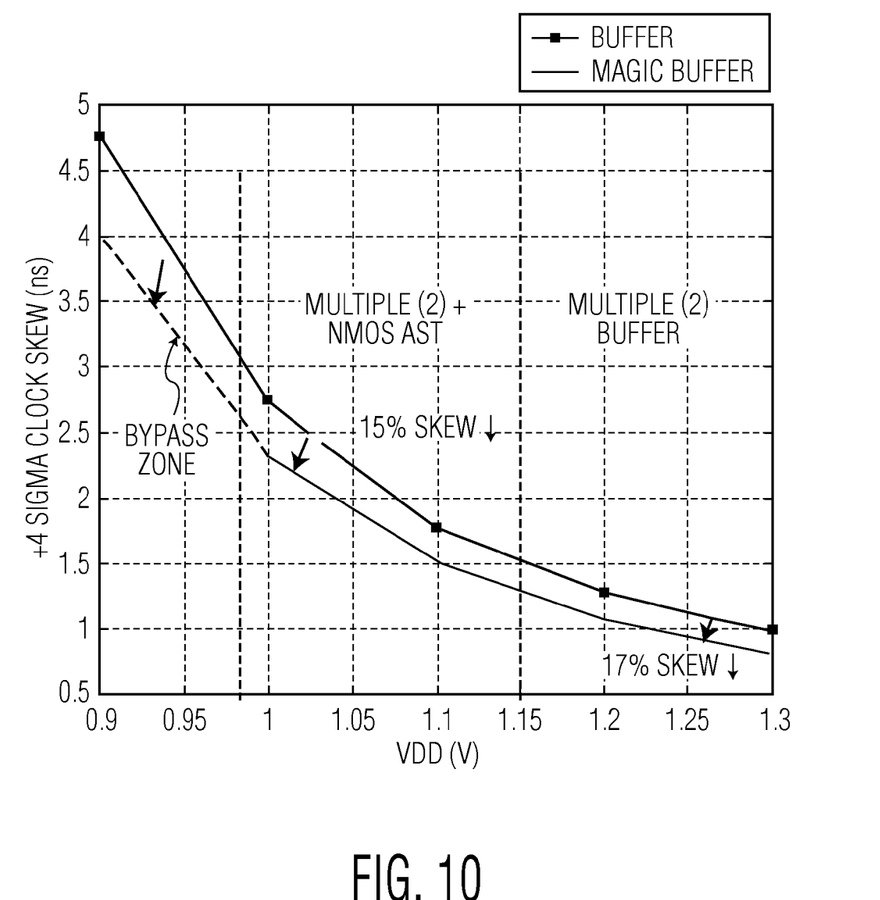
FIG. 10 shows the clock skew reduction achieved by the buffer design of the invention for the different operating modes.

FIG. 10 shows the clock skew reduction achieved by the buffer design of the invention for the different operating modes. The topology adaptation helps to mitigate the impact of process variations and reduces clock skew. In this example, the nominal VDD is 1.8V. The clock skew plotted is at at sinks (between flip flops) for which the clock source lies 4 stages earlier.

The buffer of the invention reduces the impact of process variability on delay spread by 40% compared to existing clock buffers. This helps in improving clock tree parameters (e.g. skew, jitter & slew) which are variability sensitive. The configurability helps in satisfying conflicting clock tree design requirements and reduces energy consumption for wide VDD ranges.

The invention is of particular interest for low power products but is applicable for all clock tree designs that utilize voltage scaling at run-time. Examples of possible application are products like hearing aids, or variable-supply microcontrollers.

Various modifications will be apparent to those skilled in the art.

The invention claimed is:

1. A tuneable buffer circuit for use in a clock tree, comprising:
   a voltage sensor for sensing a supply voltage;
   a set of at least two buffers coupled in parallel, each buffer having a grounding circuit for implementing a selectable grounding function;
   a bypass switch connected in parallel with the at least two buffers;

a switching arrangement for switching between different modes of operation in dependence on the sensed supply voltage, wherein in a normal mode one buffer in the at least two buffers is connected into the tuneable buffer circuit;

in a first low voltage mode the at least two buffers are connected into the tuneable buffer circuit in parallel without a grounding function;

in a second low voltage mode the at least two buffers connected into the tuneable buffer circuit in parallel with grounding function; and in a bypass mode the at least two buffers are bypassed by the bypass switch.

2. The tuneable buffer circuit as claimed in claim 1, wherein each buffer comprises two inverters connected in series, and wherein the grounding circuit provides selective grounding the junction between the inverters.

3. The tuneable buffer circuit as claimed in claim 2, wherein the grounding circuit comprises a grounding transistor connected between the junction and ground, and an enabling switch between an input clock to the tuneable buffer circuit and the gate of the grounding transistor such that the grounding function is dependent on the input clock.

4. The tuneable buffer circuit as claimed in claim 2, wherein the grounding circuit comprises a plurality of parallel grounding transistors.

5. The tuneable buffer circuit as claimed in claim 3, wherein the grounding circuit further comprises a disabling transistor for turning off the grounding transistor or grounding transistors when the grounding function is not selected.

6. The tuneable buffer circuit as claimed in claim 1, wherein the voltage sensor is for detecting that the supply voltage is:

below a device threshold voltage or near a device threshold voltage or between a device threshold voltage and an intermediate voltage level or above the intermediate voltage level.

7. The tuneable buffer circuit as claimed in claim 6, wherein the switching arrangement is adapted to:

select the bypass mode if the supply voltage is below the device threshold voltage;

select the low voltage mode with grounding function if the supply voltage is near the device threshold voltage;

select the low voltage mode without grounding function if the supply voltage is between the device threshold voltage and an intermediate voltage level; or select the normal mode if the supply voltage is above the intermediate voltage level.

8. A method of controlling a tuneable buffer circuit for use in a clock tree, the tuneable buffer circuit comprising a set of at least two buffers coupled in parallel and a bypass switch coupled to, in parallel with the at least two buffers, each buffer having a grounding circuit for implementing a selectable grounding function, wherein the method comprises:

sensing a supply voltage;

switching between different modes of operation in dependence on the sensed supply voltage, wherein in a normal mode one buffer in the at least two buffers is connected into the tuneable buffer circuit;

in a first low voltage mode the at least two buffers are connected into the tuneable buffer circuit in parallel without grounding function;

in a second low voltage mode the at least two buffers are connected into the tuneable buffer circuit in parallel with grounding function; and in a bypass mode the at least two buffers are bypassed by the bypass switch.

9. The method as claimed in claim 8, wherein each buffer comprises a two inverters connected in series, and wherein the grounding function provides selectively grounding to the junction between the inverters.

10. The method as claimed in claim 9, wherein the grounding function is controlled by an input clock.

11. The method as claimed in claim 8, comprising detecting that the supply voltage is:

below a device threshold voltage or near a device threshold voltage or between a device threshold voltage and an intermediate voltage level or above the intermediate voltage level.

12. The method as claimed in claim 11, comprising:

selecting the bypass mode if the supply voltage is below the device threshold voltage;

selecting the low voltage mode with grounding function if the supply voltage is near the device threshold voltage;

selecting the low voltage mode without grounding function if the supply voltage between a device threshold voltage and an intermediate voltage level; or select the normal mode if the supply voltage is above the intermediate voltage level.

\* \* \* \* \*